United States Patent [19]

Suzuki et al.

[11] Patent Number: 4,579,623

[45] Date of Patent: Apr. 1, 1986

[54] METHOD AND APPARATUS FOR SURFACE TREATMENT BY PLASMA

[75] Inventors: Keizo Suzuki, Arlington, Mass.; Ken Ninomiya, Nakano, Japan; Shigeru Nishimatsu, Kokubunji, Japan; Sadayuki Okudaira, Ohme, Japan; Osami Okada, Chofu, Japan

[73] Assignee: Hitachi, Ltd., Tokyo, Japan

[21] Appl. No.: 642,801

[22] Filed: Aug. 21, 1984

[30] Foreign Application Priority Data

Aug. 31, 1983 [JP] Japan ................................. 58-157826

[51] Int. Cl.[4] ...................... H01L 21/306; B05B 5/02; B05D 3/06; B44C 1/22
[52] U.S. Cl. .................................... 156/626; 118/728; 118/50.1; 118/620; 156/627; 156/643; 156/646; 156/651; 156/345; 156/656; 156/657; 156/662; 204/192 C; 204/192 E; 204/298; 252/79.1; 427/39
[58] Field of Search ............... 156/643, 646, 651, 653, 156/656, 657, 345, 659.1, 662, 626, 627; 204/164, 192 EC, 192 E, 298, 192; 427/38, 39; 118/715, 728, 50.1, 620; 252/79.1

[56] References Cited

U.S. PATENT DOCUMENTS 4,417,947 11/1983 Pan ....................................... 156/643
4,426,246 1/1984 Kravitz et al. ....................... 156/646

Primary Examiner—William A. Powell
Attorney, Agent, or Firm—Antonelli, Terry & Wands

[57] ABSTRACT

A gas is introduced into a vacuum chamber after the vacuum chamber is evacuated, and a plasma is generated within at least part of the vacuum chamber. The specimen surface is exposed to the plasma so that the surface is treated. A plurality of different gases, such as $SF_6$, $N_2$, and the like, are used as the gas being introduced. The quantity of the gas is changed during the surface treatment. A controller is used as a mechanism for changing the quantity of gas introduced. The controller is operated in accordance with a predetermined program, or by signals obtained by detecting the surface conditions of the specimen during the surface treatment.

33 Claims, 21 Drawing Figures (a)

(c)

(b)

(d)

4,579,623

METHOD AND APPARATUS FOR SURFACE TREATMENT BY PLASMA

BACKGROUND OF THE INVENTION

This invention relates generally to a method and apparatus for surface treatment by plasma, and more particularly to apparatuses for plasma etching and plasma deposition (or plasma CVD (chemical vapor deposition)) for semiconductor integrated circuits.

Surface treatment techniques using plasmas are used actively and widely. A plasma surface treatment apparatus usually comprises a vacuum chamber, means for evacuating the vacuum chamber, means for introducing a gas into the vacuum chamber, means for generating plasma within at least part of the vacuum chamber, a specimen (or substrate), and means for holding the specimen. The characteristics of plasma surface treatments vary widely with the type, composition, and concentration of the plasma-generating gas (discharge gas). Depending upon the object of the surface treatment, it is sometimes necessary to enhance specific treatment characteristics by changing at predetermined time intervals (periodically) the type, composition, and concentration of the discharge gas during the surface treatment. In prior-art apparatuses, however, no function for changing the type, composition, or concentration of the gas is provided for the gas introduction means thereof, so that only a surface treatment with predetermined characteristics can be carried out throughout the surface treatment process.

FIG. 1 illustrates a typical construction of a conventional etching apparatus using plasma. The apparatus shown in FIG. 1 is an apparatus using magnet-microwave discharge, and FIG. 2 illustrates a method using RF (radio-frequency) discharge. Means for generating the magnet-microwave discharge consists of a magnetron 1, a magnetron power supply 2, a waveguide 3, a discharge tube 4, solenoids 5 and a permanent magnet 12. The solenoids 5 and the permanent magnet 12 are both not always necessary, and either one may be used alone. Means for generating the RF discharge consists of an RF power supply 15, a capacitor 16 and upper and lower RF electrodes 13 and 14. Although the RF electrodes 13 and 14 are shown within the vacuum chamber 6 in FIG. 2, they are sometimes arranged outside the vacuum chamber 6.

The following are important factors in the application of a plasma-etching apparatus to the production of a semiconductor device:
(1) etching speed is high; and
(2) a material 24 being etched, shown in FIG. 3(a), can be etched vertically, as shown in FIG. 3(c), without any undercutting, using a mask 25, that is, a fine pattern fabrication is possible.

The etching rate can be improved by using $SF_6$ or $F_2$ as the discharge gas when the material 24 being etched is Si (or polysilicon), for example. Since this discharge gas results in extensive undercutting 26, as shown in FIG. 3(b), however, condition (2) above cannot be met thereby. Conditions (1) and (2) can be satisfied simultaneously by periodically changing the composition of the discharge gas in accordance with the present invention, as will be described later.

The apparatuses shown in FIGS. 1 and 2 can be used as plasma CVD (chemical vapor deposition) apparatuses by changing the kind of discharge gas used. When a mixed gas of $SiH_4$ and $NH_3$ is used as the discharge gas in one of the apparatuses of FIGS. 1 and 2, for example, a film of a mixture of Si and N (silicon nitride; Si—N film) is formed on the specimen surface, and this film can be used as a protective film for the resultant semiconductor device. However, when a large quantity (at least 10%, atomic density ratio) of hydrogen is mixed into this silicon nitride film, the device characteristics is reduced [R. B. Fair et al: IEEE, ED-28, 83–94 (1981)]. When a mixed gas of $SiF_4$ and $N_2$ is used as the discharge gas in the apparatus of FIG. 1, silicon nitride can be formed similarly. In this case, however, the fluorine mixed into the film raises a problem. The present invention can greatly reduce the quantity of the hydrogen or fluorine mixed therein by changing periodically the composition of the discharge gas.

SUMMARY OF THE INVENTION

The present invention is directed to realize characteristics which can not be accomplished by conventional plasma surface treatment apparatuses, by providing means for periodically changing, either once or a plurality of times, the type, composition and concentration of the discharge gas during surface treatment.

It is another object of the present invention to provide a method and apparatus which makes it possible to carry out etching or dispersion of a specimen surface at a high rate and without undercuts.

In a surface treatment method in which a vacuum chamber is evacuated, a gas is introduced into the vacuum chamber, and a plasma is then generated within at least part of the vacuum chamber so that the surface of a specimen is treated by this plasma, the method of the present invention is characterized in that the quantity of gas introduced is changed during the surface treatment of the specimen.

In a surface treatment apparatus consisting of a vacuum chamber, means for evacuating the vacuum chamber, means for introducing a gas into the vacuum chamber, means for generating plasma within at least part of the vacuum chamber, and means for holding a specimen whose surface is being treated by the plasma, another characterizing feature of the present invention lies in a plasma surface treatment apparatus wherein the gas introduction means is provided with a mechanism for changing the quantity of gas being used, during the surface treatment.

The type, composition, and concentration of the discharge gas are parameters which are most effective in changing the plasma surface treatment characteristics. Therefore, specific surface treatment characteristics can be stressed by changing the type, composition, and concentration of the discharge gas during surface treatment.

DESCRIPTION OF THE PREFERRED EMBODIMENTS

Hereinafter, preferred embodiments of the invention will be described with reference to the accompanying drawings.

Figure 1:
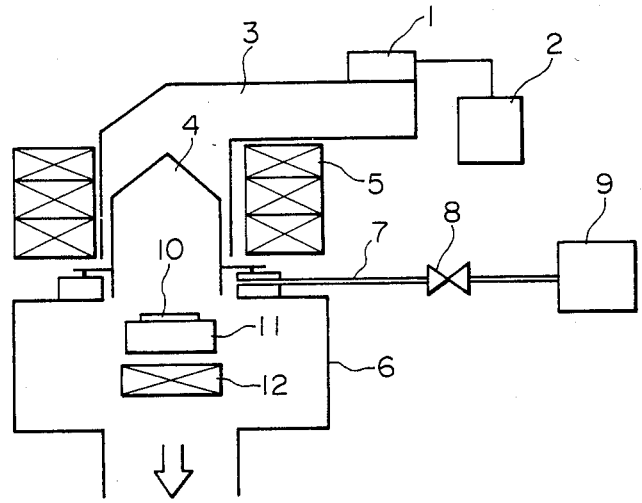
FIGS. 1 and 2 illustrate conventional plasma surface treatment apparatuses.
Figure 2:
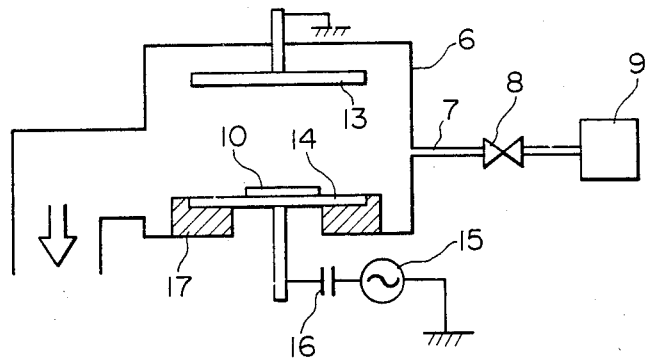
Figure 3:
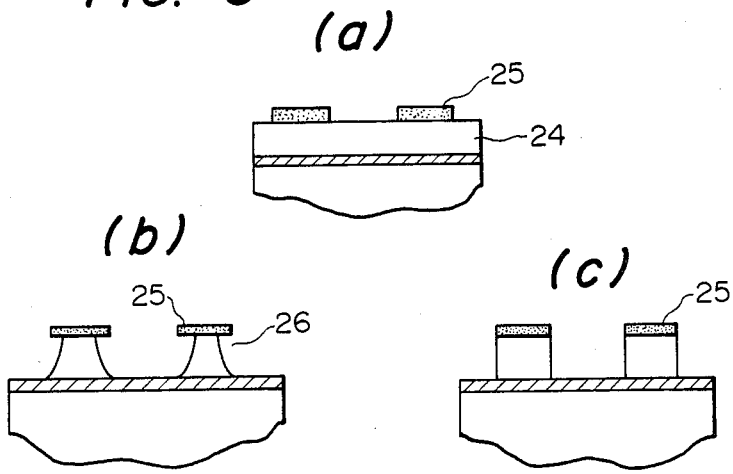
FIGS. 3(a–c) is schematic views illustrating vertical etching and non-vertical etching.
Figure 4:
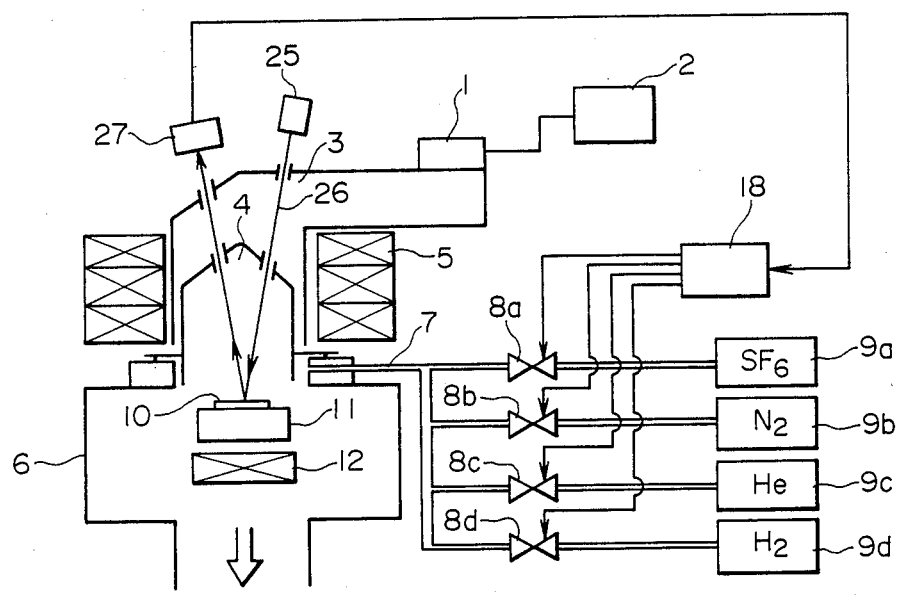
FIG. 4 is a block diagram of one embodiment of the present invention.

FIG. 4 shows the construction of a plasma-etching apparatus in accordance with the present invention. Magnet-microwave discharge is used as the plasma generation means, and Si (or poly-Si) is the material being etched in this embodiment. Components other than gas feed means are the same as those of the apparatus of FIG. 1. The gas feed means consists of gas sources 9a, 9b, 9c and 9d for four different gases, i.e., $SF_6$, $N_2$, He, and $H_2$, gas flow rate adjusting needle valves 8a, 8b, 8c, and 8d fitted to the gas sources, respectively, and piping 7. However, the characterizing feature of this invention is that the quantity of gas supplied by the needle valve 8a for $SF_6$ is electrically controlled by a controller 18.

In this embodiment, the vacuum chamber 6 is first evacuated to a high vacuum (about $1 \times 10^{-6}$ Torr), and then a predetermined quantity of discharge gas is supplied. For example, $SF_6$ is at $5 \times 10^{-4}$ Torr, $N_2$ is at $5 \times 10^{-5}$ Torr, He is at $5 \times 10^{-5}$ Torr, and $H_2$ is at $2.5 \times 10^{-5}$ Torr in terms of the partial pressure within the vacuum chamber 6. However, the effect of the present invention remains unchanged even when each partial pressure varies over a wide range (about $1 \times 10^{-5}$ Torr to about $5 \times 10^{-3}$ Torr). Next, a magnetic field is generated at the discharge tube 4 by the solenoids 5. Microwaves (frequency: 1–10 GHz, usually 2.45 GHz) from the magnetron are introduced into the discharge tube 4, generating a magnet-microwave discharge. Etching proceeds by the physical and chemical reactions between the active species (e.g., $F^+$ ions and F radicals) generated by the discharge and the Si surface.

Figure 5:
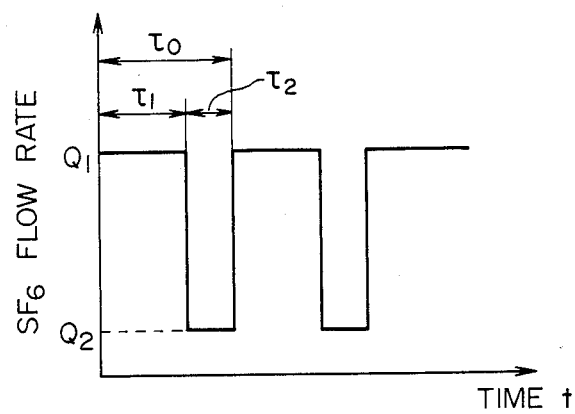
FIG. 5 is a graph of an example of the control of the flow rate of $SF_6$ gas in FIG. 4.

The characterizing feature of this embodiment is that the flow rate of the $SF_6$ gas during etching is changed as shown in FIG. 5. Changes of the gas flow rate are automatically controlled by the controller and the needle valve. The supply of $SF_6$ gas into the vacuum chamber is made at a gas flow rate $Q_1$ for a period $\tau_1$, and then at a flow rate $Q_2$ for a period $\tau_2$. The values of $Q_1$ and $Q_2$ are arbitrary. For example, $Q_1$ can be a flow rate necessary for providing a partial pressure of $5 \times 10^{-4}$ Torr ($Q_1 = 1$–10 sccm when a standard exhaust system is used), and $Q_2$ can be zero. Although the conditions for determining $\tau_1$ and $\tau_2$ will be described later, $\tau_1 = 25$ sec and $\tau_2 = 5$ sec can be selected, for example. According to this arrangement, high-speed etching by $SF_6$ gas (etching rate > 200 nm/min) can be realized without undercutting. A controller 18 may be operated by scanning a laser beam 26 from a laser 25 on the surface of the specimen 10, sensing the surface condition of the specimen 10 by a sensor 27 and applying the signal to the controller 18. The reasons why such high-speed, vertical etching can be accomplished for the first time in accordance with the present invention will now be described.

Figure 6:
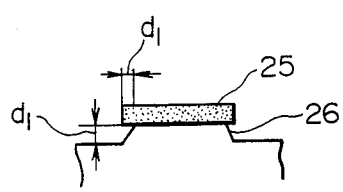
FIGS. 6(a–d) is schematic views of the progress of etching.
Figure 6:
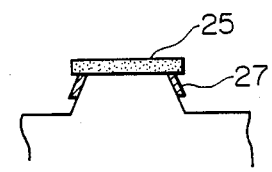
Figure 6:
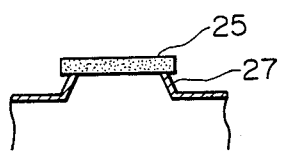
Figure 6:
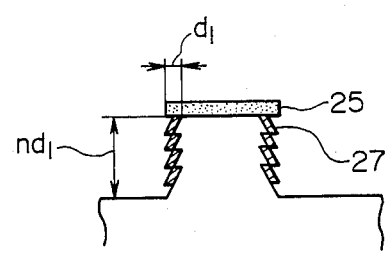

In the first period $\tau_1$ after the start of etching, large quantities of active species (e.g., $F^+$ ions and F radicals) are generated in the plasma, and etching proceeds. The specimen is at a negative floating potential V (V = about $-20$ V) with respect to the plasma, and the $F^+$ ions strike the specimen surface perpendicularly. Accordingly, etching by the $F^+$ ions is perpendicular to the specimen surface and does not generate undercutting. On the other hand, since F radicals are electrically neutral, they strike the specimen surface at all angles and generate undercutting. However, F radicals exhibit a greater effect than $F^+$ ions in etching with $SF_6$ gas, so that the etched shape is isotropic as shown in FIG. 6(a). This means that when the surface is etched to a depth of $d_1$ in the vertical direction within the period $\tau_1$, and undercutting 26 of about $d_1$ also occurs in the lateral direction. Next, when the supply of $SF_6$ gas is stopped, the $F^+$ ions and the F radicals in the plasma are exhausted and disappear, so that only discharge by $N_2$, He, and $H_2$ occurs. The $N^+$ ions and the N radicals generated during this discharge nitrify the Si surface (both the horizontal and side surfaces) as shown in FIG. 6(b). (That is, a silicon nitride film 27 is formed on the surface.)

The reason the supply of $SF_6$ gas is stopped is that a firm silicon nitride film will not be formed when there are $F^+$ ions and F radicals present. The He is mixed in for the following reason. When the supply of $SF_6$ gas is stopped, a stable discharge can not be maintained at the partial pressure ($5 \times 10^{-5}$ Torr) of $N_2$ alone. The discharge can be stabilized by mixing chemically-inert He thereinto to increase the discharge gas pressure (total pressure). Therefore, a similar effect can be obtained by replacing He by other rare gases such as Ne, Ar, Kr, Xe, etc. The reason why $H_2$ is mixed thereinto is to suitably reduce the F radical concentration during the gas supply.

Next, when $SF_6$ gas is again supplied, the $F^+$ ions and the F radicals strike the specimen surface. However, since F radicals alone can barely etch the silicon nitride film, the side wall covered with the silicon nitride film 27 are not etched, but etching in the vertical direction and etching of the newly-appeared side wall proceed. The size of the undercut at this time is also $d_1$. In other words, the state shown in FIG. 6(c) is produced. After these procedures are repeated, etching is made to the cross-sectional shape shown in FIG. 6(d). Assuming that the supply of $SF_6$ gas is interrupted n times with $\tau_0 = \tau_1 + \tau_2$ being one period, the total etching time $t_e$ is given by the following equation:

$$t_e = n\tau_0 \tag{1}$$

The etching depth $d_p$ in the vertical direction and the quantity of etching (undercut quantity) $d_v$ in the horizontal direction are given by:

$$d_p = n \cdot d_1 \tag{2}$$

$$d_v = d_1 \tag{3}$$

Since the relationship $d_p/d_v > 10$ is generally necessary for vertical etching, the following relationship is necessary:

$$n > 10 \tag{4}$$

when a $SF_6$ pressure is low and etching with little undercutting is possible, however, the value of n may be small.

The following relationship must also be fulfilled, when $\tau_r$ is the time necessary for the exhaust of the $F^+$ ions and the F radicals after the supply of $SF_6$ gas is stopped:

$$\tau_2 << \tau_r \tag{5}$$

$\tau_r$ is time during which the gas molecules and atoms stay within the vacuum chamber, and is given by $\tau_r = V/S$, where V is the volume (l) of the vacuum chamber and S is the pumping speed (l/sec) of the exhaust system. Since V is about 20 l and S is about 1,000 l/sec in a standard apparatus, $\tau_r \approx 0.02$ sec = 20 msec. Therefore, the following relationship must be satisfied, from equation (5):

$$\tau_2 << 20 \text{ msec} \tag{6}$$

Experiments reveal that the etching depth in the vertical direction must be at most 200 nm during the period $\tau_1$. This is because if it is more than that, the silicon nitride film which has already been formed will be etched, thereby increasing the undercutting. If the final etching rate in the vertical direction is $\epsilon$ (nm/min), the following relationship must be satisfied:

$$\tau_1 < (200/\epsilon) \times 60 \tag{7}$$

If $\epsilon = 200$ nm/min, for example, $\tau_1$ must be smaller than 60 sec. Since etching is not effected in the period $\tau_2$, it is necessary in practice that $\tau_2 << \tau_1$. On the basis of these conditions, the above illustrates the result when $\tau_1 = 25$ sec and $\tau_2 = 5$ sec. It has been confirmed experimentally that the same effect (that is, etching substantially free from undercutting at an Si etching rate $\epsilon \approx 200$ nm/min) can be obtained when $\tau_1 = 5-60$ sec and $$\tau_2 = \left( \frac{1}{5} \text{ to } \frac{1}{50} \right) \times \tau_1.$$

Although the embodiment shown in FIG. 4 concerns an apparatus using magnet-microwave discharge, the same effect can also be obtained by applying the present invention to a plasma-etching apparatus using RF discharge. Although the embodiment of FIG. 4 uses a mixed gas of $SF_6 + N_2 + He + H_2$, the same effect can be obtained by using $F_2$ instead of $SF_6$, or by using other halogen-containing gases [e.g., $C_nF_m$ ($CF_4$, $C_2F_6$, $C_3F_8$, $C_4F_8$, $C_4F_{10}$, etc), $NF_3$, $Cl_2$ gas, $C_nCl_m$ ($CCl_4$, $C_2Cl_6$, etc) gas, $C_nF_mCl_k$ (n, m, k: integer) gas, $C_nF_mCl_kH_i$ (n, m, k, i: integer) gas, $BCl_3$, and other Br- or I-containing gases].

The same effect can also be obtained by using, instead of $N_2$, $O_2$ or C—H compound gases, or gases containing one or a plurality of elements selected from N, O and C. (Because silicon oxide and SiC films are not etched by F radicals similarly to silicon nitride films.) When $O_2$ is used, however, the problem occurs that the photoresist used as a masking material is easily etched. The effect of the present invention remains unchaged when the mixing of $H_2$ is stopped when the partial pressure of $SF_6$ is at an appropriate pressure. Although the embodiment described above illustrates the case in which the material being etched is Si (or poly-Si), the same effect can be obtained when the material being etched is Mo, W, Al or their silicides. Although the specimen table and the specimen are positioned below the discharge tube in the embodiment described above, they may be arranged within the discharge tube. This arrangement can increase the quantities of $F^+$ ions and F radicals striking the surface of the specimen, and can therefore increase the etching rate.

Figure 7:
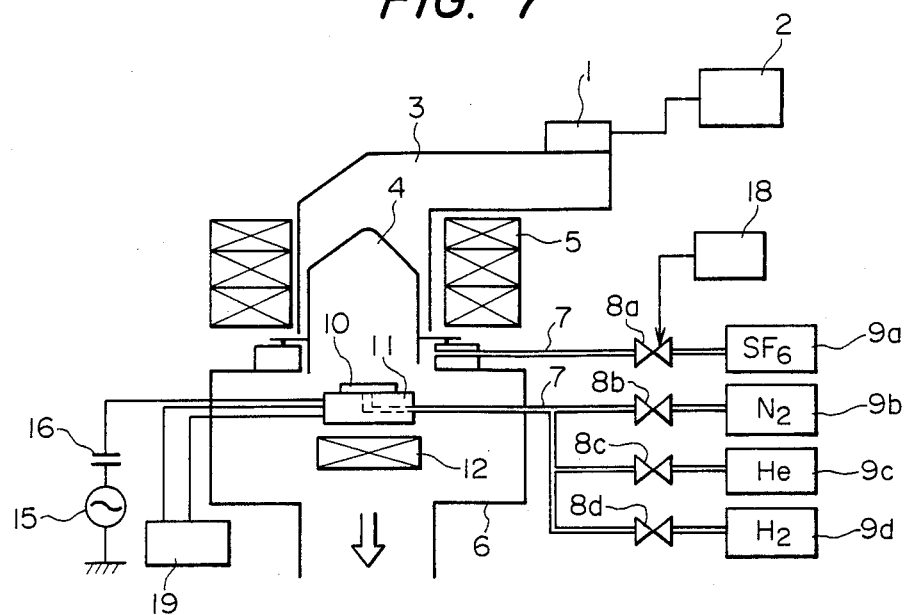
FIG. 7 shows a second embodiment of the present invention.

FIG. 7 shows another embodiment of the invention, which differs from the foregoing embodiment in the following points.

(1) Means for applying an external voltage 15 to the specimen table 11 and to the specimen 10 is provided. The external voltage may be either DC or AC, but when there is a thin electrically-insulating film on the surface of the specimen, an AC voltage (radio frequency (RF) voltage) is better in that charge-up of the thin insulating film can be avoided. Experiments reveal that a suitable RF lies between 100 to 1,000 KHz, and a suitable amplitude of the RF voltage between 0 to 200 V.

(2) A mechanism 19 for cooling the specimen table 11 is provided.

(3) $N_2$ plus He and $H_2$ gases (sometimes $N_2$ plus He or $H_2$) are introduced through the specimen table 11 and the gap between the specimen table 11 and the specimen 10 into the vacuum chamber 6.

The functions of (2) and (3) can prevent any temperature rise of the specimen 10 during etching. This is effective in preventing any deterioration of the photoresist as the mask material. Since the function of (1) can accelerate the ions incident to the specimen, the etching rate can be increased while undercutting can be reduced.

The RF voltage (external voltage) may be applied constantly during the etching (surface treatment). Since the application of the RF voltage accelerates the deterioration and consumption of the mask material, however, it is effective to stop the application of the RF voltage during the period that the supply of $SF_6$ gas is stopped (that is, the period $\tau_2$ of FIG. 5), in order to prevent the deterioration and consumption of the mask material.

The effects brought forth by this embodiment can be obtained even when:

(1) the material being etched is replaced by materials other than Si and poly-Si (Mo, W, Al and their silicides);

(2) $SF_6$ is replaced by other halogen-containing gases (see the description of the embodiment shown in FIG. 4);

(3) He is replaced by other rare gases; and (4) $H_2$ is removed.

Cooling of the specimen table and the method of introducing the gas through the specimen table are effective in any other plasma-etching apparatus and surface treatment apparatus to which the present invention can be applied. The method of applying the RF voltage is effective in all the plasma surface treatment apparatuses to which the present invention can be applied. The controller 18 can determine $\tau_1$ and $\tau_2$ in accordance with a program prepared in advance.

Figure 8:
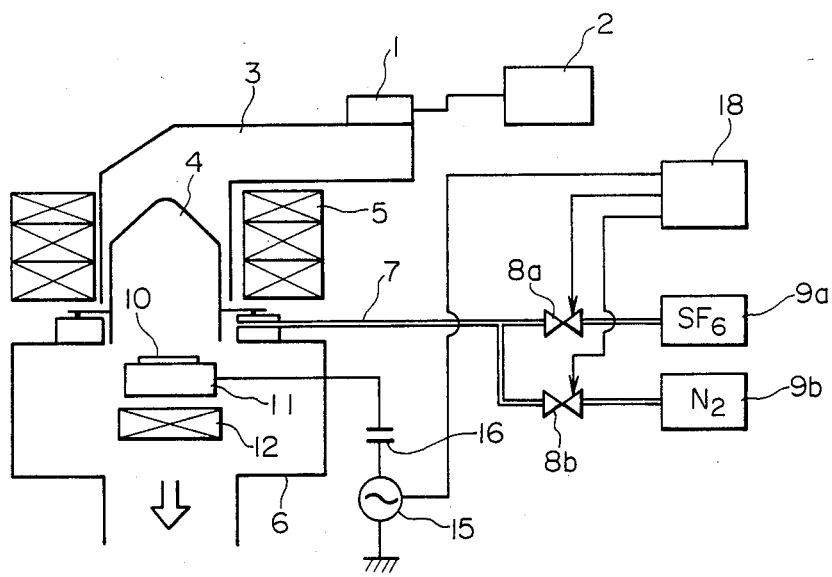
FIG. 8 shows a third embodiment of the present invention.
Figure 9:
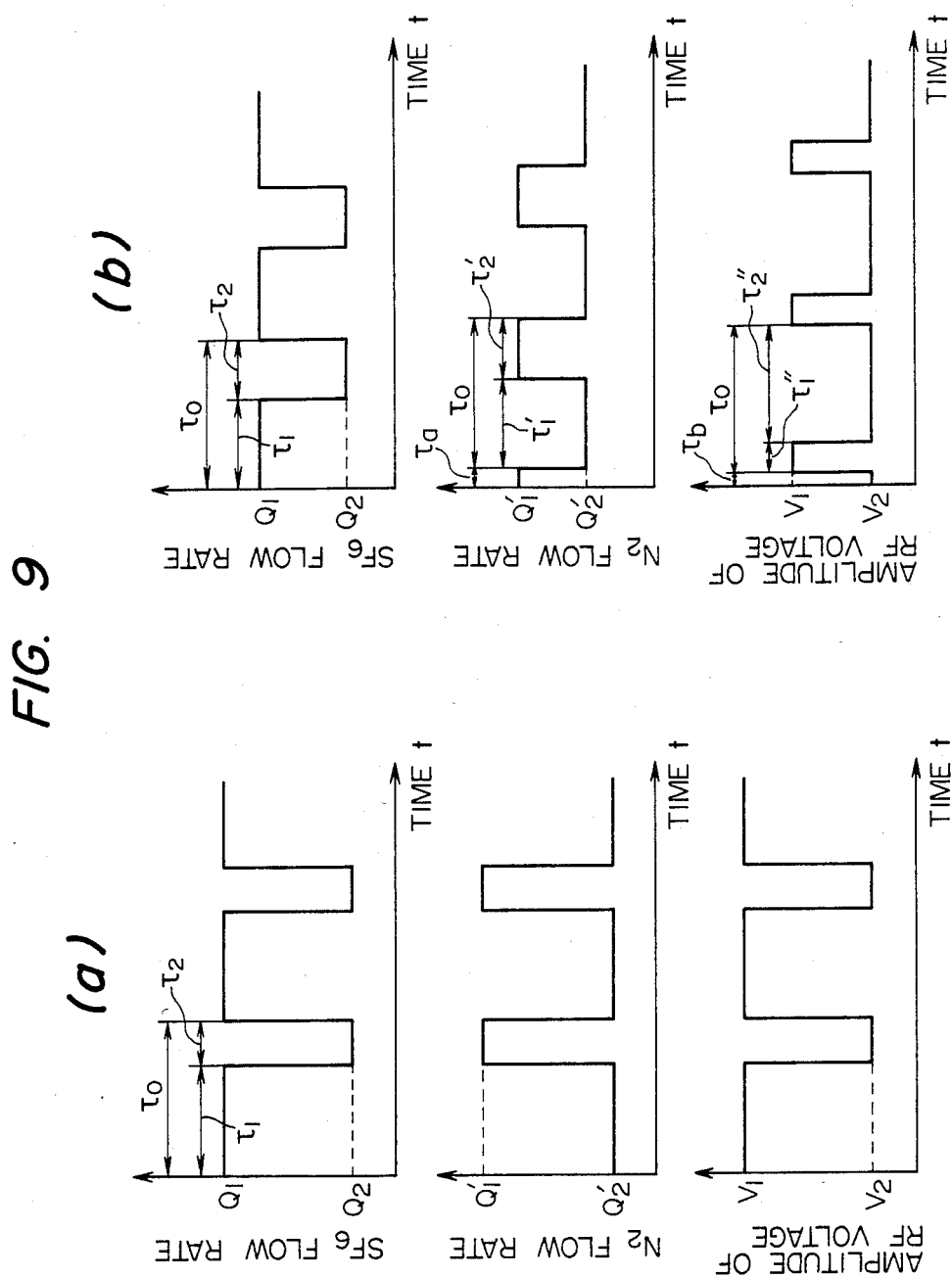
FIGS. 9(a and b) is graphs of examples of the control of gas flow rate and applied RF (radio frequency) voltage.

FIG. 8 shows still another embodiment of the present invention. This embodiment is characterized in that not only the gas flow rate of $SF_6$ but also the gas flow rate of $N_2$ and driving and stopping of the RF power supply 15 are controlled by the electric signals from the controller 18. He and $H_2$ are not used in this embodiment. FIG. 9(a) shows an example of the control of the gas flow rates of $SF_6$ and $N_2$ and the control of the RF voltage.

The appropriate values for $\tau_1$, $\tau_2$ and $\tau_0$ are those for the embodiment shown in FIG. 4, for example, it is possible to use the values $\tau_1 = 27.5$ sec and $\tau_0 = 2.5$ sec. The gas flow rates $Q_1$, $Q_2$, $Q_1'$ and $Q_2'$ are arbitrary, and it is possible, for example, to use $Q_1 = Q_1'$, and $Q_2 = Q_2' = 0$. Values can be selected for $Q_1$ and $Q_1'$ so that the gas pressure within the vacuum chamber is $5 \times 10^{-4}$ Torr, for example. The values for $V_1$ and $V_2$ are also arbitrary, they may be $V_1 = 100$ V and $V_2 = 0$ V, for example. The reason why the amplitude of the RF voltage is changed is the same as that described with reference to the embodiment of FIG. 7.

Unlike the embodiment of FIG. 4, this embodiment stops the supply of $SF_6$ gas and, at the same time, increases the supply of $N_2$ gas, thereby providing the following advantages.

(1) Since the gas pressure within the vacuum chamber is always held at a pressure high enough to maintain the discharge (generally, at least $1 \times 10^{-4}$ Torr), introduction of auxiliary discharge gas (a rare gas such as He), which is necessary in the embodiment of FIG. 4, is not necessary here.

(2) Since the partial pressure of $N_2$ increases during the period $\tau_2$, a compact silicon nitride protective film can be formed within a short period $\tau_2$.

In accordance with the method of this embodiment, etching without any undercutting can be realized when the rate of etching silicon is 250 nm/min. The method of this embodiment can of course be applied to etching or surface treatment apparatuses for other materials, by changing the type of gas used.

In the embodiment described above, the timing at which quantities of $SF_6$ and $N_2$ supplied are changed, and the timing at which the applied RF voltage is changed are the same, but these timings may differ from each other (see FIG. 9(b)). Symbols $\tau_a$ and $\tau_b$ represent mutual phase deviations. Deterioration of the device characteristics can be minimized by reducing the time $\tau_1''$ of the application of the RF voltage below $\tau_1$ to the minimum necessary level.

Figure 10:
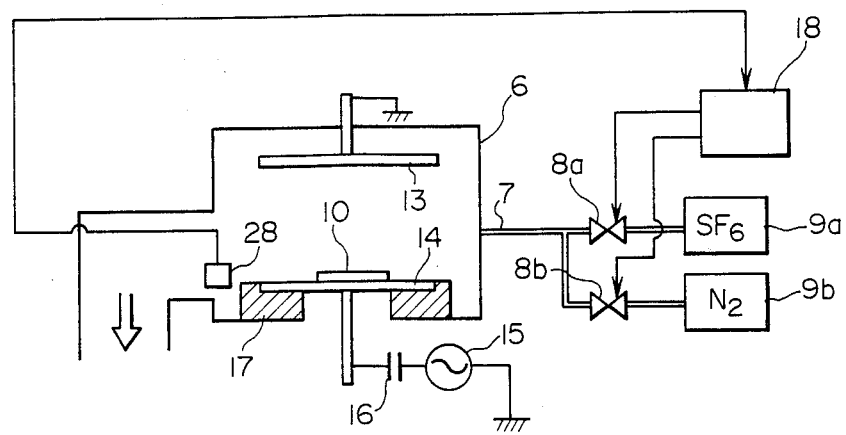
FIGS. 10 through 13 show fourth to seventh embodiments of the present invention, respectively.

FIG. 10 shows still another embodiment of the invention in which the method described with reference to FIG. 8 is applied to an etching apparatus utilizing RF discharge.

A thickness monitor 28 is arranged laterally to the specimen 10, to read out the change in thickness of the surface of the specimen 10 from differences in the inherent frequency of the crystal, and actuate the controller 18 by a signal therefrom.

Figure 11:
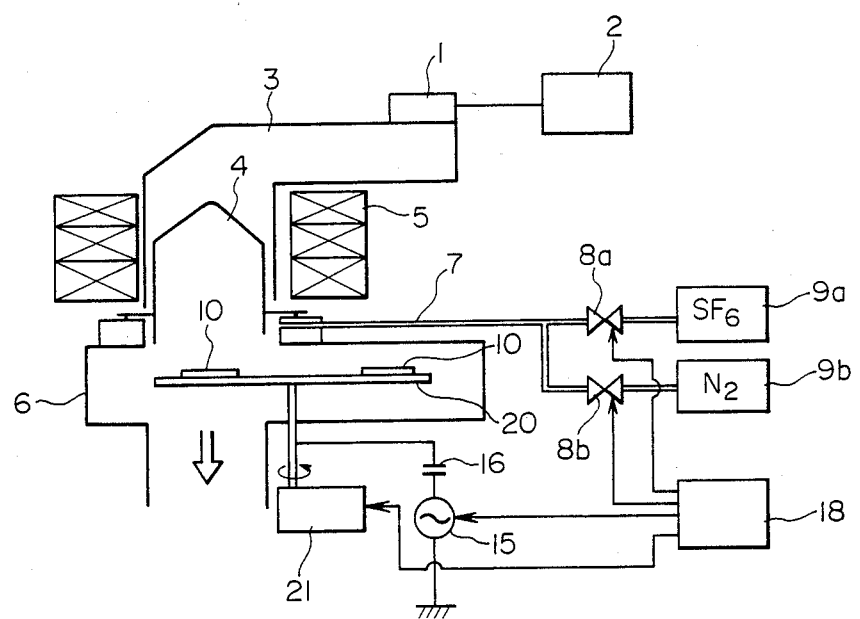

FIG. 11 shows still another embodiment of the invention, in which the present invention is applied to an etching apparatus which simultaneously etches a plurality of specimens 10 by use of a rotating (rotation-revolution) plate 20. Etching proceeds while the plasma intermittently radiates the specimen surfaces. Magnet-microwave discharge is used as the plasma generation means. In this embodiment, an RF voltage can be applied to the specimen table and the gas flow rate as well as the applied RF voltage can be controlled by the controller 18 in the same way as in the embodiment of FIG. 8. It is noteworthy in this embodiment that the rotation of the rotating plate 20 must be interlocked with the control of the gas flow rate and the applied RF voltage in order to assure the uniformity of etching for the specimens 10. As shown in the drawing, therefore, a driving mechanism 21 for actuating the rotating plate is preferably operated by electric signals from the controller 18 (or vice versa). Generally, it is preferred that the period $\tau_0$ of the controller 18 of FIG. 9 satisfies the relationship $\tau_r/\tau_0 \approx$ integer or $\tau_0/\tau_r \approx$ integer. This embodiment can be applied to a plasma CVD apparatus by changing the type of the gas used.

Figure 12:
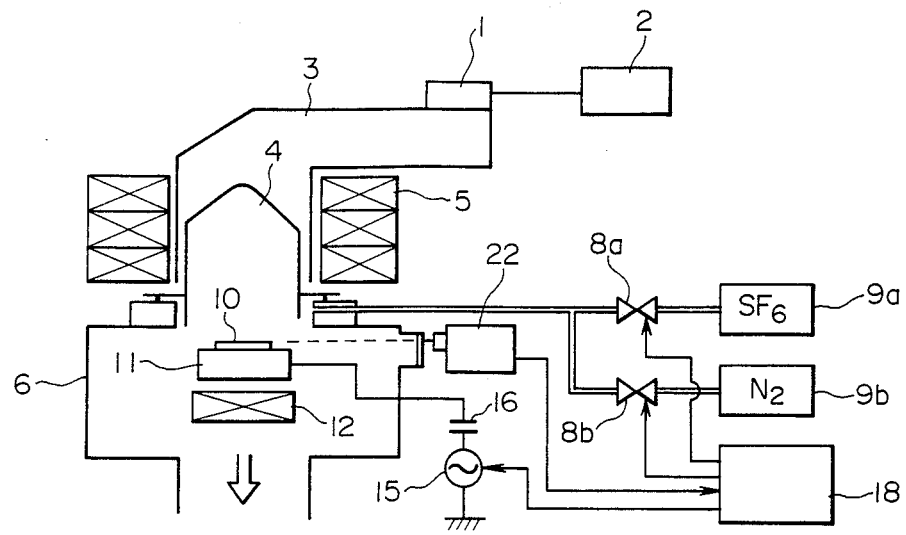

FIG. 12 shows still another embodiment of the invention, in which the present invention is applied to an etching apparatus provided with an end-point detection system 22. This embodiment uses magnet-microwave discharge as the method of generating plasma. End-point detection is generally carried out by detecting a change in the state of the plasma when the material being etched is no longer present. However, the state of the plasma changes greatly when the type, composition and concentration of the gas supplied are changed, so that the timing at which the end-point detection signal is to be taken from the plasma must be interlocked with the control of the gas flow rate and the applied RF voltage. For this reason, the end-point detection system 22 of this embodiment is operated when signals from the controller 18 are received. The method of this embodiment can also be applied to other plasma-etching apparatuses, and to etching by use of other discharge gases, in the same way as in the embodiments of FIGS. 4 and 8.

Besides a rectangular cross-sectional shape obtained by vertical etching, it is sometimes desired to obtain a trapezoidal or inverted trapezoidal cross-sectional shape (which is effective for isolating devices or for removing over-hang). Such a desire can be fulfilled by suitably changing the values $\tau_1$, $\tau_2$, $\tau_0$, $Q_1$, $Q_2$, $Q_1'$, $Q_2'$, $V_1$ and $V_2$ during the etching.

Figure 13:
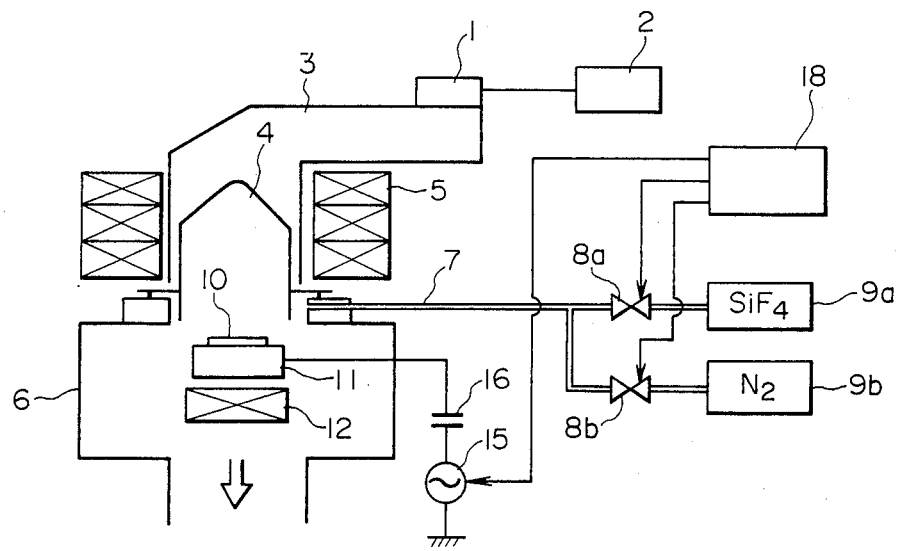
Figure 14:
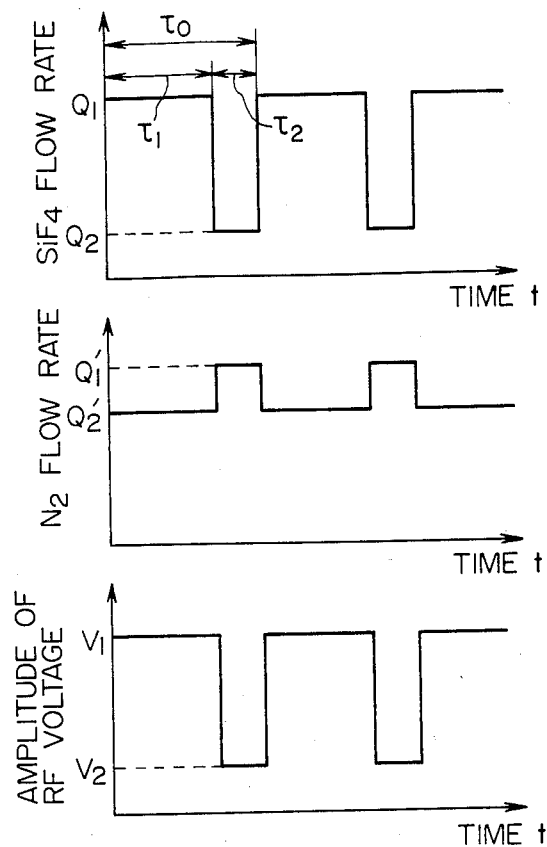
FIG. 14 shows an example of the control of the gas flow rate and the applied voltage of the embodiment of FIG. 13.

FIG. 13 shows still another embodiment of the invention, in which the present invention is applied to a plasma CVD apparatus. Magnet-microwave discharge is used as the means for generating plasma. This embodiment illustrates the case in which a silicon nitride film (Si—N film) is formed by $SiF_4$ and $N_2$ gases. Although the structure is the same as that of the embodiment of FIG. 8, $SF_6$ gas is replaced by $SiF_4$ gas. FIG. 14 illustrates an example of the control of the gas flow rate and applied RF voltage. Although the conditions for $\tau_1$, $\tau_2$ and $\tau_0$ will be described later, it is possible to use the values $\tau_1 = 3$ sec, $\tau_2 = 3$ sec and $\tau_0 = \tau_1 + \tau_2 = 6$ sec, for example. Though $Q_1$, $Q_2$, $Q_1'$ and $Q_2'$ are arbitrary, the values $Q_1$ and $Q_1'$ can be selected, for example, so that the pressures of the $SiF_4$ and $N_2$ within the vacuum chamber are $4 \times 10^{-4}$ Torr and $8 \times 10^{-4}$ Torr, respectively. It is possible to use the values $Q_2 = 0$, $Q_2' = \frac{1}{2}Q_1'$. The values $V_1$ and $V_2$ are also arbitrary, an example is $V_1 = 100$ V and $V_2 = 50$ V. In accordance with this embodiment, an Si—N film with less mixture of F elements can be formed for the following reason. The Si—N film is formed on the surface of the specimen by the discharge of $(SiF_4 + N_2)$ during the period $\tau_1$, and the F atoms mix into the film at this time.

Next, when the supply of $SiF_4$ gas is stopped and the quantity of $N_2$ supplied is increased (during the period $\tau_2$), the N radicals generated by the $N_2$ discharge strike the surface of the Si—N film, and isolate and evaporate the F atoms from the film by the following reaction:

$$2(Si-F)+2N \rightarrow 2(Si-N)+F_2 \uparrow$$

Since this process is repeated, an Si—N film with less mixture of F elements can be formed.

In the same way as in the embodiment of FIG. 4, the period $\tau_2$ must be sufficiently greater than the residence time $\tau_r$ of the gas molecules and atoms within the vacuum chamber 6. That is, the following relationship must be satisfied:

$$\tau_2 >> \tau_r \approx 20 \text{ msec} \tag{8}$$

Experiments reveal that in order to sufficiently remove the F elements during the period $\tau_2$, it is necessary that the thickness of the film formed during the period $\tau_1$ is no more than 10 nm. That is, the period $\tau_1$ must satisfy the following relationship when D (nm/min) is the speed of the film formation when the film is continuously formed with $\tau_2=0$ sec:

$$\tau_1 < (10/D) \times 60 \tag{9}$$

Since $D \approx 100$ nm/min generally, it is necessary that $$\tau_1 < 6 \text{ sec} \tag{10}$$

A method analogous to the method of this embodiment can be applied to other plasma CVD apparatuses using RF discharge. It can also be applied to plasma CVD apparatuses for other than Si—N films if the gas is changed.

Figure 15:
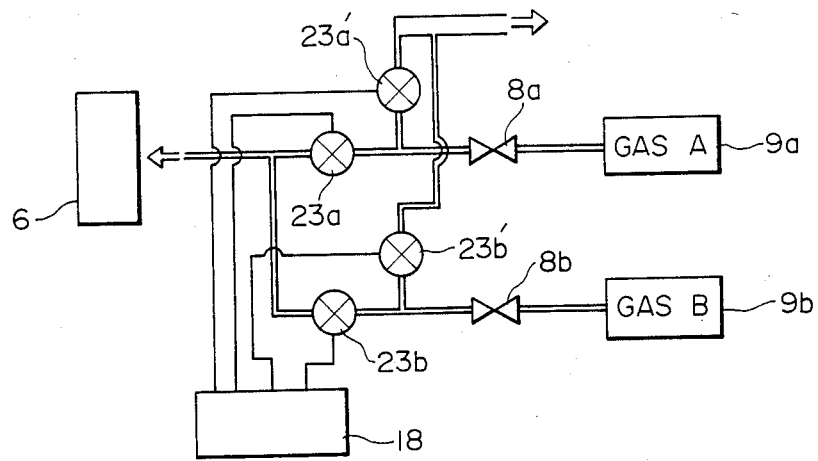
FIG. 15 shows an example of a control mechanism for the flow rate of introduced gas.

FIG. 15 shows a method of controlling the gas flow rate by use of a valve. This method can be applied to all embodiments of the present invention. This embodiment consists of a needle valve, two valves 23a and 23a' and piping for each type of gas (for a gas A, for example). The operations of these two valves 23a and 23a' are controlled by signals from the controller 18. The gas from gas cylinders 9a and 9b is controlled by the needle valves 8a and 8b so that a constant quantity of gas always flows. When the valve 23a is opened and the valve 23a' is closed, the gas can be introduced into the vacuum chamber. The introduction of the gas into the vacuum chamber can be stopped by closing the valve 23a, but if this state is kept as such, gas remains between the valve 23a and the needle valve 8a, so that the gas will jet into the vacuum chamber when the valve 23a is next opened. To prevent this problem, the valve 23a' is opened simultaneously as the valve 23a is closed so as to discharge the gas remaining between the valve 23a and the needle valve 8a. Next, in order to reintroduce gas into the vacuum chamber, the valve 23a' is closed and the valve 23a is opened. The characterizing feature of this method is that the reproducibility and controllability of the flow rate control are high. The two valves 23a and 23a' can be replaced by a single three-way valve. The types of gases shown in FIG. 15 may be increased, if necessary.

The present invention can change the characteristics of surface treatment in a time sequence by changing the type, composition and concentration of a discharge gas of a plasma surface treatment apparatus during surface treatment, and can enhance specific treatment characteristics for predetermined periods of time. As a result, the present invention can accomplish surface treatment characteristics that can not be obtained by prior-art apparatuses.

What is claimed is:

1. In a method of treating the surface of a specimen in which a vacuum chamber is evacuated, a gas is introduced into said vacuum chamber, a plasma is generated within at least part of said vacuum chamber, and the surface of said specimen is treated by said plasma, a plasma surface treatment method characterized in that a first quantity of said gas is introduced, and the quantity of gas introduced is changed during the surface treatment of said specimen, the introducing of the first quantity of gas and the changed quantity of gas constituting a cycle, and wherein said cycle is repeated at least once.

2. The plasma surface treatment method as defined in claim 1 wherein the quantity of said gas introduced is changed in accordance with a predetermined program.

3. The surface treatment method as defined in claim 1 wherein the quantity of said gas introduced is changed in accordance with the conditions of said surface treatment.

4. In an apparatus consisting essentially of a vacuum chamber, means for evacuating said vacuum chamber, means for introducing a gas into said vacuum chamber, means for generating plasma within at least part of said vacuum chamber, and means for holding a specimen being surface-treated by said plasma, a plasma surface treatment apparatus characterized in that said gas introduction means is equipped with a mechanism for changing the quantity of said gas introduced during surface treatment, to introduce a first quantity of gas and then a changed quantity of gas during surface treatment, the introduction of the first quantity of gas and the changed quantity of gas being a cycle of gas introduction, the gas introduction means further including means to repeat said cycle at least once.

5. The plasma surface treatment apparatus as defined in claim 4 wherein said mechanism for changing the quantity of said gas introduced is a controller.

6. The plasma surface treatment apparatus as defined in claim 4 wherein said mechanism for changing the quantity of said gas introduced changes the quantity of said gas introduced in accordance with a predetermined program.

7. The plasma surface treatment apparatus as defined in claim 6 wherein the change in said gas introduced is periodical.

8. The plasma surface treatment apparatus as defined in claim 7 wherein the period of said change is longer than the time during which gas molecules or atoms remain within said vacuum chamber.

9. The plasma surface treatment apparatus as defined in claim 7 wherein said mechanism for changing the quantity of said gas introduced changes the quantity of said gas introduced in accordance with a program which measures the condition of the progress of said surface treatment, and feeds back said condition.

10. In an apparatus consisting essentially of a vacuum chamber, means for evacuating said vacuum chamber, means for introducing a gas into said vacuum chamber, means for generating plasma within at least part of said vacuum chamber, means for holding a specimen being surface-treated by said plasma, and means for applying an external voltage to said specimen, a plasma surface treatment apparatus characterized in that said gas introduction means is equipped with a mechanism for changing the quantity of said gas introduced during said surface treatment, to introduce a first quantity of gas and then a changed quantity of gas during said surface treatment, the introduction of the first quantity of gas and the changed quantity of gas being a cycle of gas introduction, the gas introduction means further including means to repeat said cycle at least once.

11. The plasma surface treatment apparatus as defined in claim 10 wherein said external voltage is a radio-frequency (RF) voltage.

12. The plasma surface treatment apparatus as defined in claim 10 or 11 wherein said mechanism for changing the quantity of said gas introduced changes the application of said voltage in accordance with said change in the quantity of said gas introduced.

13. The plasma surface treatment apparatus as defined in claim 10 wherein said mechanism for changing the quantity of said gas introduced changes intermittently the plasma radiation onto said specimen in accordance with said change in the quantity of said gas introduced.

14. In an apparatus consisting essentially of a vacuum chamber, means for evacuating said vacuum chamber, means for introducing a gas into said vacuum chamber, means for generating plasma within at least part of said vacuum chamber, and means for holding a specimen being surface-treated by said plasma, a plasma surface treatment apparatus characterized by including a mechanism for changing the quantity of said gas introduced, to introduce a first quantity of gas and then a changed quantity of gas into the vacuum chamber during the plasma surface treatment, the introduction of the first quantity of gas and the changed quantity of gas being a cycle of gas introduction, the mechanism further including means to repeat said cycle at least once, and means for detecting the end point of the surface treatment of said specimen from signals from said mechanism.

15. The plasma surface treatment method as defined in claim 1 wherein in introducing one of said first quantity of gas and the changed quantity of gas the surface of the specimen is treated under a discharge condition for promoting etching, and in introducing the other of the first quantity of gas and the changed quantity of gas the surface of the specimen is treated under a discharge condition for changing the characteristics of the surface of the specimen.

16. The plasma surface treatment method as defined in claim 15 wherein in introducing the first quantity of gas the surface of the specimen is treated under a discharge condition for promoting etching, and in introducing the changed quantity of gas the surface of the specimen is treated under a discharge condition for changing the characteristics of the surface of the specimen.

17. The plasma surface treatment method as defined in claim 16 wherein the first quantity of gas includes a halogen-containing gas.

18. The plasma surface treatment method as defined in claim 17 wherein the halogen-containing gas is $SF_6$.

19. The plasma surface treatment method as defined in claim 17 wherein the changed quantity of gas includes at least one of elemental nitrogen, carbon or oxygen, or a compound containing oxygen, nitrogen or carbon.

20. The plasma surface treatment method as defined in claim 16 wherein the changed quantity of gas includes at least one of elemental nitrogen, carbon or oxygen, or a compound containing oxygen, nitrogen or carbon.

21. The plasma surface treatment method as defined in claim 20 wherein the changed quantity of gas consists essentially of at least one rare gas and $H_2$ in addition to at least one of elemental nitrogen, carbon or oxygen, or a compound containing oxygen, nitrogen or carbon.

22. The plasma surface treatment method as defined in claim 16 wherein the cycle is repeated at least ten times.

23. The plasma surface treatment method as defined in claim 22 wherein, for each cycle, the first quantity of gas is introduced for a longer period of time than the period of time that the changed quantity of gas is introduced.

24. The plasma surface treatment method as defined in claim 1 wherein the surface of the specimen is made of a material selected from the group consisting of Si, Mo, W, Al, and silicides of Mo, W and Al.

25. The plasma surface treatment method as defined in claim 1 wherein in introducing the first quantity of gas the surface of the specimen is treated under a discharge condition for depositing a coating on the surface, and in introducing the changed quantity of gas the specimen is treated under a discharge condition for changing the characteristics of the coating.

26. The plasma surface treatment method as defined in claim 25 wherein the first quantity of gas includes $SiF_4$ and $N_2$, and the changed quantity of gas includes $N_2$ with no $SiF_4$.

27. The plasma surface treatment method as defined in claim 26 wherein the coating deposited during each cycle of introducing the first quantity of gas is at most 10 nm in thickness.

28. The plasma surface treatment apparatus as defined in claim 4 further comprising cooling means for cooling the specimen during plasma surface treatment to prevent temperature rise of the specimen.

29. The plasma surface treatment apparatus as defined in claim 4 wherein said means for holding a specimen comprises a rotatable means for holding a plurality of specimens.

30. The plasma surface treatment apparatus as defined in claim 29 further comprising means for rotating said rotatable means, and wherein said means for rotating said rotatable means and said gas introduction means are interlocked.

31. The plasma surface treatment apparatus as defined in claim 4 further comprising means for treating the surface of the specimen under a discharge condition for promoting etching when one of the first quantity and changed quantity of gas is introduced, and means for treating the surface of the specimen under a discharge condition for changing the characteristics of the surface of the specimen when the other of the first quantity and changed quantity of gas are introduced.

32. The plasma surface treatment apparatus as defined in claim 10 further comprising means for treating the surface of the specimen under a discharge condition for promoting etching when one of the first quantity and changed quantity of gas is introduced, and means for treating the surface of the specimen under a discharge condition for changing the characteristics of the surface of the specimen when the other of the first quantity and changed quantity of gas are introduced.

33. The plasma surface treatment apparatus as defined in claim 14 further comprising means for treating the surface of the specimen under a discharge condition for promoting etching when one of the first quantity and changed quantity of gas is introduced, and means for treating the surface of the specimen under a discharge condition for changing the characteristics of the surface of the specimen when the other of the first quantity and changed quantity of gas are introduced.

* * * * *